US006847530B2

(12) United States Patent
James

(10) Patent No.: US 6,847,530 B2
(45) Date of Patent: Jan. 25, 2005

(54) LOW OUTPUT NOISE SWITCHED MODE POWER SUPPLY WITH SHIELDLESS TRANSFORMERS

(75) Inventor: David Alun James, Christchurch (NZ)

(73) Assignee: Invensys Energy Systems (NZ) Limited, Christchurch (NZ)

(*) Notice: Subject to any disclaimer, the term of this patent is extended or adjusted under 35 U.S.C. 154(b) by 0 days.

(21) Appl. No.: 10/474,648
(22) PCT Filed: Apr. 12, 2002
(86) PCT No.: PCT/NZ02/00071
§ 371 (c)(1),
(2), (4) Date: Jun. 17, 2004
(87) PCT Pub. No.: WO02/084679
PCT Pub. Date: Oct. 24, 2002

(65) Prior Publication Data
US 2004/0223350 A1 Nov. 11, 2004

(30) Foreign Application Priority Data
Apr. 12, 2001 (NZ) .............................. 511144

(51) Int. Cl.[7] .............................................. H02M 1/12
(52) U.S. Cl. ........................................ 363/39; 363/47
(58) Field of Search ..................... 363/39, 47

(56) References Cited

U.S. PATENT DOCUMENTS

| 3,731,234 A | * | 5/1973 | Collins .......................... 333/1 |
| 4,326,179 A |   | 4/1982 | Lasar |
| 4,686,614 A |   | 8/1987 | Costello |
| 4,888,675 A | * | 12/1989 | Kumar et al. ................. 363/47 |
| 5,335,161 A |   | 8/1994 | Pellegrino et al. |
| 6,137,392 A |   | 10/2000 | Herbert |
| 6,765,811 B1 | * | 7/2004 | Chang .......................... 363/39 |

FOREIGN PATENT DOCUMENTS

JP    2000333463    11/2000

* cited by examiner

Primary Examiner—Jeffrey Sterrett
(74) Attorney, Agent, or Firm—Myers Bigel Sibley & Sajovec

(57) ABSTRACT

A switched mode power supply which uses a shieldless transformer (11) in the dc to dc converter. Common mode switching noise is reduced by connecting two capacitors (17, 18) in series between the transformer primary (12) and secondary (13) circuits and connecting an inductor (19) between the junction of the two capacitors (17, 18) and chassis earth. The values of the capacitors (17, 18) and inductor (19) are selected such that the capacitors (17, 18) present a low impedance to noise signals and the inductor (19) presents a high impedance to noise signals.

5 Claims, 4 Drawing Sheets

LOW OUTPUT NOISE SWITCHED MODE POWER SUPPLY WITH SHIELDLESS TRANSFORMERS

RELATED APPLICATIONS

The present application is a 35 U.S.C. §371 national phase application of PCT International Application No. PCT/NZ02/00071, having an international filing date of 12 Apr. 2002, and claiming priority to New Zealand Patent Application No. 511144, filed 12 Apr. 2001, the disclosure of which is incorporated herein by reference in their entireties. The above PCT International Application was published in the English language and has International Publication No. WO 02/084679 A1.

TECHNICAL FIELD

This invention relates to switched mode power supplies, and in particular to the reduction of common mode switching noise on the dc output

BACKGROUND ART

The heart of all switched mode power supplies ("SMPS") is the dc to dc converter stage. While various switching and circuit topologies are available, a transformer effective to transfer power at the switching frequency is always provided for two reasons. The first is to make use of the transformer primary to secondary turns ratio to secure the required output voltage at maximum efficiency, and the second is to secure isolation between the input and output of the supply.

The converter transformer may have one or more primary windings which may be connected so as to vary the effective transformer turns ratio as a function of input frequency as disclosed in applicant's U.S. Pat. No. 5,907,236. The transformer secondary may have a single winding or be centre tapped In many SMPS applications switching noise on the dc output must be minimised. Regulations limiting "dc conducted enissions" are being promulgated in Europe. Switching noise is conveyed to the dc output through the converter transformer. One technique for minimising common mode noise transfer is to screen the primary and secondary windings. A third screen connected to chassis earth may be included between the two windings to minimise input-output capacitance. This is shown in FIG. 1. This ensures that noise signals are returned to the noise sources through the shortest possible path, rather than appear between the transformer secondary winding and chassis earth. This technique means the transformers are expensive. Apart from the additional screening materials the construction of shielded transformers is labour intensive and reliability may be compromised if the terminations between the grounding leads and the shields are not of high quality and have the potential to make electrical contact with any of the windings. Shields also result in reduced efficiency, due to eddy current losses.

An alternative technique for reducing common mode noise on the do supply would be to connect a capacitor of suitable value between the transformer secondary circuit and the transformer primary circuit. This would form a capacitance divider with the transformer primary to secondary capacitance and so reduce both the voltage and impedance of the noise source. However the provision of such a capacitor greatly increases the input-to-output capacitance of the supply and in some applications will exceed the maximum input-to-output capacitance allowable. Further, in many cases the input-to-output capacitance of the transformer alone may make desired minimums difficult to attain

SUMMARY OF INVENTION

It is therefore an object of the present invention to provide a transformer circuit for a switch mode power supply which reduces the switching noise at the supplied dc output while overcoming the abovementioned disadvantages.

Accordingly in a first aspect the invention consists in a switched mode power supply including a do to dc converter with a transformer operable at the converter switching frequency having one or more primary windings and one or more secondary windings, the improvement comprising:

two capacitors in series connected between the secondary transformer circuit and primary transformer circuit, and an inductor connected between the junction of said two capacitors and chassis ear, the values of said capacitors and inductors being selected such that said series capacitors present a low impedance to noise signals and said inductor presents a high impedance to noise frequencies.

In a second aspect the invention consists in a transformer circuit for a dc to dc converter which reduces switching noise at the dc output comprising:

a transformer operable at the converter switching frequency having one or more primary windings and a secondary winding;

two capacitors in series connected between the secondary transformer circuit and primary transformer circuit, and an inductor connected between the junction of said two capacitors and chassis earth, the values of said capacitors and inductors being selected such that said series capacitors present a low impedance to noise signals and said inductor presents a high impedance to noise frequencies.

In a third aspect the invention consists in a transformer with a low dielectric medium interposed between primary and secondary windings.

DETAILED DESCRIPTION OF THE INVENTION

Figure 1:
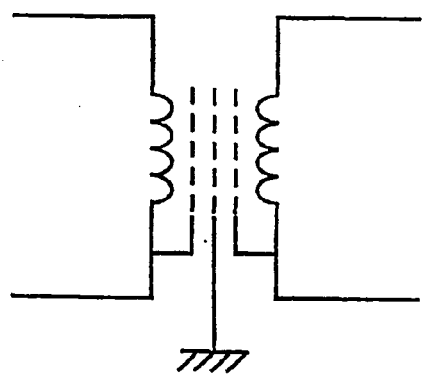
FIG. 1 shows, a prior art shielded transformer for a SMPS.
Figure 2A:
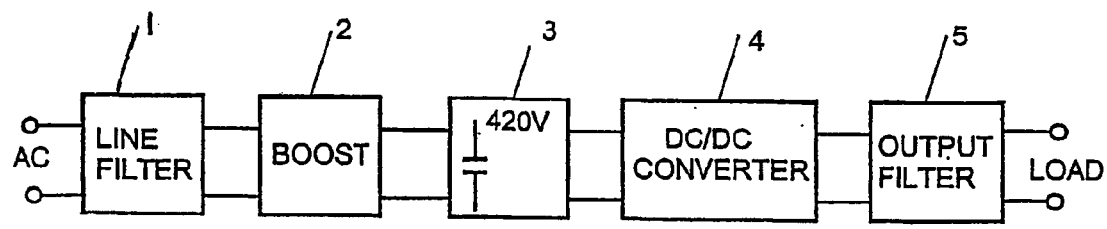
FIG. 2 shows a block diagram of a typical SMPS.

The present invention resides in the transformer circuit of the dc to dc converter in a SMPS. A typical SMPS is as shown in FIG. 2(a) made up of functional blocks 1 to 5. The AC mains is filtered by a line filter 1, then a boost converter 2 produces DC at say 420 v across reservoir capacitor 3.

Figure 2B:
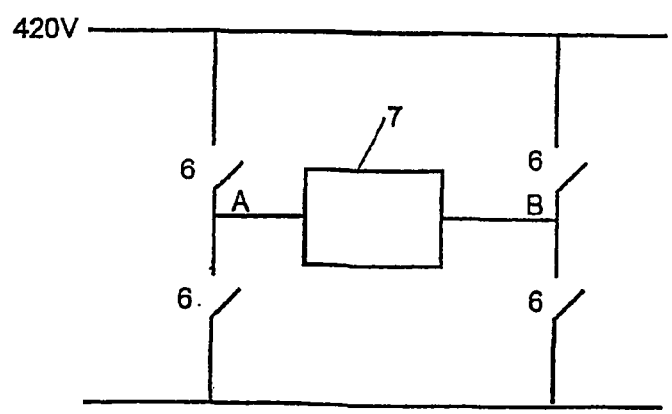

A dc to dc converter 4 then provides the desired output voltage (say 24V or 48V nominal) and isolation. The dc to dc converter 4 incorporates a switching circuit shown diagrammatically in FIG. 2(b) to provide a square wave to transformer circuit 7 which is shown in more detail configured around transformer 11 in FIG. 2(c). The switching circuit employs four power FETs arranged in the bridge configuration shown although other arrangements could be used.

Figure 2C:
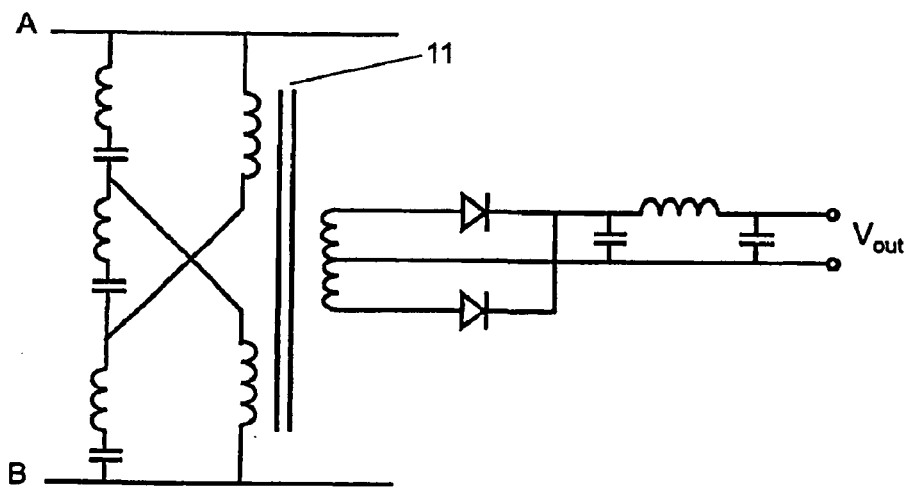

In the preferred embodiment the transformer primary circuit shown in FIG. 2(c) is of the type disclosed in U.S. Pat. No. 5,907,236. Conventional primary circuit configurations could alternatively be used. The transformer secondary winding is centre tapped and a conventional full wave rectifier used to provide the converter (and power supply) dc output voltage $V_{out}$.

Figure 3A:
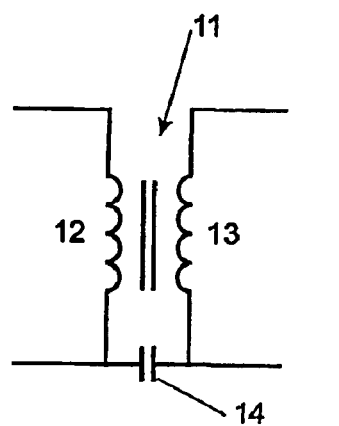
FIG. 3 shows in amplified form SMPS transformer circuits incorporating the present invention.
Figure 3B:
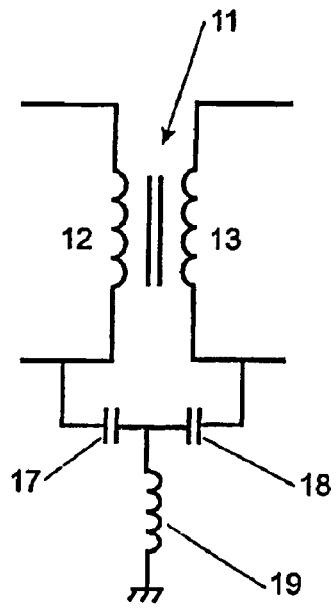

The principles of the present invention will be described with reference to FIG. 3(a) where for the sake of simplicity a dc converter transformer 11 is shown having a single primary winding 12 and a single secondary winding 13. The voltage in the primary winding is a square wave at the switching frequency, that being determined by the frequency of the switching devices 6 switching voltage from the dc input to the transformer primary. Because the transformer primary voltage is a square wave, considerable noise will be present due to the presence of the harmonics of the switching frequency. In a conventional non-shielded transformer these harmonics will be capacitively coupled into the secondary winding to a greater or lesser extent The present invention effectively inserts a by-pass capacitor 14 between the secondary winding 13 and the primary winding 12 to provide a return path for common mode noise signals present in the secondary winding 13 back to the source of the noise signals (the switching devices 6) as shown in FIG. 3(a). For simplicity a capacitor is shown connected to only one end of each of the primary and secondary windings. Referring to FIG. 3(b) input to output capacitance between the primary and secondary windings is minimised by using two capacitors 17 and 18 in series to provide the effective bypass capacitance with an inductor 19 connected from their junction to chassis earth which has a low impedance to frequencies well below the noise frequencies (typically above 100 k Hz).

Figure 4:
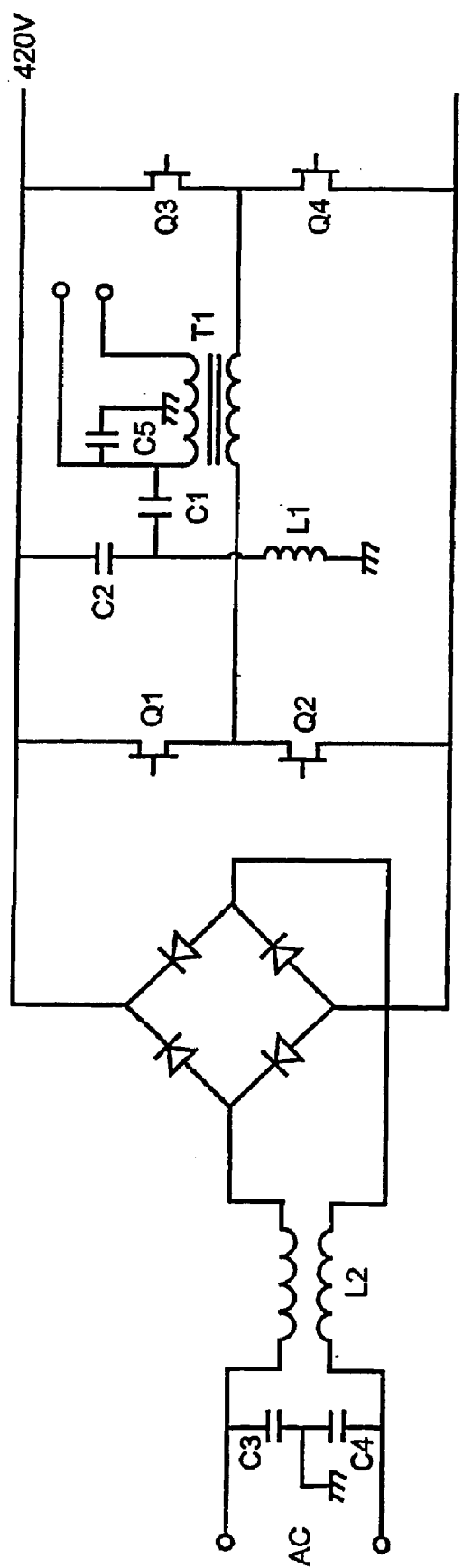
FIG. 4 shows a simplified circuit for a SUPS according to one preferred is embodiment of the present invention.

Referring now to FIG. 4 a simplified circuit for the preferred embodiment of the invention is shown. As well as making use of the split by-pass capacitor technique already described use is made of a common mode choke in the line filter stage of the power supply. Capacitor $C_1$ forms one half of the split by-pass capacitor and is connected between one end of the secondary winding of transformer $T_1$ and $C_2$ the other half of the by-pass capacitor. The other end of $C_2$ connects to the primary winding of $T_1$ through either of switching transistors $Q_1$ or $Q_3$, whichever is turned on.

A conventional common mode choke $L_2$ is incorporated in the AC line filter to reduce noise emission back into the mains. However the same common mode choke $L_2$ is used to filter noise current flowing through the transformer $T_1$. Capacitors $C_3$, $C_4$ and $C_5$ ensure that noise currents flowing back to the noise source flow through common mode choke $L_2$ to be considerably attenuated. The noise current in the preferred embodiment is thus forced to flow from source, through transformer $T_1$, through ground (chassis), through choke $L_2$ and back to source. Suitable values for capacitors $C_1$, $C_2$ arm 4.7 nF, for capacitors $C_3$, $C_4$ are 4.7 nF, and for chokes $L_1$ and $L_2$ 2 mH.

The present invention allows inexpensive non-shielded transformers to be used in SMPSs having low dc conducted emissions in place of expensive shielded transformers previously required and without increased input to output capacitance. Incidental benefits include increased reliability and efficiency.

Figure 5:
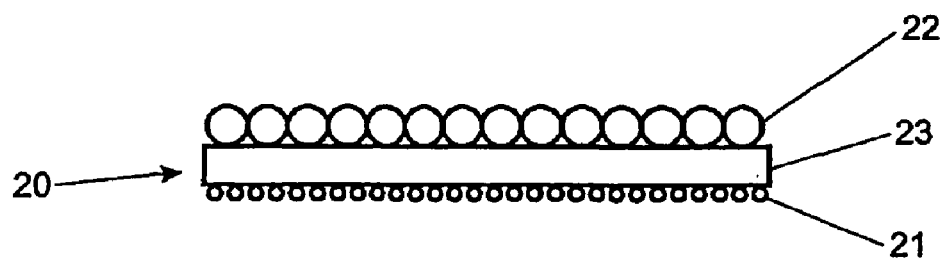
FIG. 5 shows two adjacent winding layers in an SMPS transformer according to the third aspect of the invention.

Capacitance coupline between input and output can be reduced by introducing a relatively inexpensive modification to conventional shieldless transformer construction. Referring to FIG. 5 the capacitance between the primary and secondary windings 21 and 22 of a dc to dc converter transformer 20 will be a function of the value of the dielectric separating the layers of windings. Advantage is taken of this by introducing a layer of low dielectric material 23 between the windings. This can be teflon or nomex which each have a dielectric value of around 2 which is lower than air, paper and other materials normally found between transformer windings.

Various modifications, alterations and variations that will readily occur to those of skill in the art are intended to be within the scope and spirit of the invention. Accordingly, the foregoing description of the preferred embodiments is by way of example only and is not intended as limiting. The scope of the invention is defined only by the following claims and the equivalents thereto.

What is claimed is:

1. In a switched mode power supply including a dc to dc converter with a transformer operable at the converter switching frequency having one or more primary windings and one or more secondary windings, the improvement comprising:

two capacitors in series connected between the secondary transformer circuit and primary transformer circuit, and an inductor connected between the junction of said two capacitors and chassis earth, the values of said capacitors and inductors being selected such that said series capacitors present a low impedance to noise signals and said inductor presents a high impedance to noise frequencies.

2. A switched mode power supply according to claim 1 wherein said power supply includes an AC line filter having a common mode choke and by-pass capacitors are connected between the AC line and chassis earth and between the transformer secondary and chassis earth to cause noise currents passing through chassis earth to be returned to source through said common mode choke.

3. A switched mode power supply according to claim 1 wherein said two capacitors are connected between one end of the transformer primary winding and one end of the transformer secondary winding and two further capacitors in series are connected between the other end of the secondary winding and the other end of the primary winding and the junction of said two further capacitors is also connected to said inductor.

4. A transformer circuit for a switched mode power supply for a dc to dc converter which reduces switching noise at the dc output comprising:

a transformer operable at the converter switching frequency having one or more primary windings and a secondary winding;

two capacitors in series connected between the secondary transformer circuit and primary transformer circuit, and an inductor connected between the junction of said two capacitors and chassis earth, the values of said capacitors and inductors being selected such that said series capacitors present a low impedance to noise signals and said inductor presents a high impedance to noise frequencies.

5. A transformer circuit for a switched mode power supply according to claim 4, wherein said two capacitors are connected between one end of the transformer primary winding and one end of the transformer secondary winding and two further capacitors in series are connected between the other end of the secondary winding and the other end of the primary winding and the junction of said two further capacitors is also connected to said inductor.

* * * * *